(12) United States Patent
Aipperspach et al.

(10) Patent No.: US 7,528,646 B2
(45) Date of Patent: May 5, 2009

(54) ELECTRICALLY PROGRAMMABLE FUSE SENSE CIRCUIT

(75) Inventors: Anthony Gus Aipperspach, Rochester, MN (US); David Howard Allen, Rochester, MN (US); Phil Paone, Rochester, MN (US); David Edward Schmitt, Rochester, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 11/550,960

(22) Filed: Oct. 19, 2006

(65) Prior Publication Data

US 2008/0106323 A1 May 8, 2008

(51) Int. Cl.
H01H 37/76 (2006.01)
H01H 85/00 (2006.01)
(52) U.S. Cl. ....................................... 327/525
(58) Field of Classification Search ................... 327/525
See application file for complete search history.

(56) References Cited

U.S. PATENT DOCUMENTS 6,384,664 B1 * 5/2002 Hellums et al. ............. 327/525
6,426,668 B1 * 7/2002 Morrish et al. ............. 327/525
6,919,754 B2   7/2005 Kuroki
7,304,527 B1 * 12/2007 Guzman et al. ............ 327/525
2004/0227562 A1 * 11/2004 Kuroki ....................... 327/525
2006/0136858 A1   6/2006 Erickson et al.
2006/0244511 A1 * 11/2006 Newman ..................... 327/525

OTHER PUBLICATIONS

IBM Patent Application ROC920050241US1, U.S. Appl. No. 11/297,311, Hovis et al., eFuse Sense Circuit, filed Dec. 8, 2005.

* cited by examiner

Primary Examiner—Donovan Lincoln
Assistant Examiner—John W Poos
(74) Attorney, Agent, or Firm—Robert R. Williams

(57) ABSTRACT

A electrically programmable fuse sense circuit having an electrically programmable fuse and a reference resistance. A first current source is coupled, through a first switch, to the electrically programmable fuse. A second current source is coupled, through a second switch, to the reference resistance. A precharge signal enables the first current source, the second current source and closes the first switch and the second switch, creating voltage drops across the electrically programmable fuse and the reference resistance. When the precharge signal goes inactive, the first current source and the second current source are shut off, and, at the same time the first switch and the second switch are opened. A latching circuit uses a difference in the voltage drops when the precharge signal goes inactive to store a state of the electrically programmable fuse, indicative of whether the electrically programmable fuse is blown or unblown.

1 Claim, 4 Drawing Sheets

ELECTRICALLY PROGRAMMABLE FUSE SENSE CIRCUIT

BACKGROUND OF THE INVENTION

1. Field of the Invention

This invention relates generally to electrically programmable fuse technology, and in particular, to circuitry used to sense whether an electrically programmable fuse is blown or unblown.

2. Description of the Related Art

Modern electronic systems frequently use one or more electrically programmable fuses on a semiconductor chip to personalize function of the semiconductor chip in a particular electronic system. An electrically programmable fuse may be blown during manufacturing or may be blown at a later time, for example, in a customer's office. A state of an electrically programmable fuse (i.e., whether the electrically programmable fuse is "blown" or "unblown") or of a plurality of electrically programmable fuses is used on the semiconductor chip to enable function, disable function, or to change function of the semiconductor chip. For example, a test function needed to test an electronic function may not be needed subsequent to the test of the electronic function. To save power, the test function may be disabled after the test has been performed. As a second example, a particular electronic function may be used in a military or other security sensitive application. Circuitry may be configured to detect attempts to tamper with the particular electronic system. Upon detection of an attempt to tamper with the particular electronic system, an electrically programmable fuse is blown to disable the particular electronic system, or to alter its behavior. Other uses of electrically programmable fuses include, but are not limited to, providing customized function to a customer, for examples, providing variations on cache sizes, cache associativity, driver/receiver voltage levels, and the like.

Modern electrically programmable fuses are typically constructed using a polysilicon shape, the polysilicon having a relatively high resistivity. A metal silicide (e.g., titanium silicide) is formed on a top surface of the polysilicon shape, the metal silicide having a relatively lower resistivity. An electrically programmable fuse is "blown" by running sufficient current through the electrically programmable fuse to cause the metal silicide to be removed from at least a portion of the polysilicon shape. For example, the current may cause electromigration in the metal silicide, causing the removal of the metal silicide from at least a portion of the polysilicon shape.

US2006/0136858, for example, teaches "blowing" of an electrically programmable fuse: "For some embodiments, driving a current of about 10 milliamperes at about 2.5-3.5 volts for about 200 microseconds through the silicide layer 202 causes the temperature of the silicide layer 202 and the polysilicon line 201 to rise, which sets up a thermal gradient. The thermal gradient causes the silicide layer 202 to migrate toward one end of the polysilicon line 201 as a result of electromigration principles, however, the current through the silicide layer 202 is sustained as long as the polysilicon line 201 remains hot, intrinsic, and conductive. The thermal gradient forces the electromigration of the silicide layer 202 to completion, i.e., drives the bulk of the silicide 202 in the fuse link 208 to the polysilicon layer 201, resulting in the non conductive depleted section 209 of the blown fuse illustrated in FIG. 2C." . . . "The components then cool down, and the electrically programmable fuse is left with the highly resistive polysilicon line having an uncontiguous coating of the conductive silicide 202 (the conductive silicide 202 has migrated to one end of the polysilicon line and left the opposing end of the line bare."

Application Ser. No. 11/297,311 filed on Dec. 8, 2005 teaches of resistance tolerances of blown electrically programmable fuses and unblown electrically programmable fuses, as well as circuitry used to blow an electrically programmable fuse. Detailed understanding of application Ser. No. 11/297,311 is not required for the present application; it will suffice to know that special circuitry is needed to blow an electrically programmable fuse and that resistance tolerances in both blown and unblown electrically programmable fuses are, in general, relatively large, and that tracking of similar devices on a semiconductor chip is imperfect.

FIG. 1A shows a prior art electrically programmable fuse sense circuit 20 configured to sense an electrically programmable fuse 12. Electrically programmable fuse 12 has a first value of resistance RFUSE (within a first range of resistance of an unblown electrically programmable fuse) when electrically programmable fuse 12 is unblown. Electrically programmable fuse 12 has a second value of resistance RFUSE (with a second range of resistance of a blown electrically programmable fuse) when electrically programmable fuse 12 is blown. Special circuitry used to blow electrically programmable fuse 12 is not shown, for simplicity (NFETs N10B and N11B are shown, however, and protect N10A, N11A when electrically programmable fuse 12 is being blown). A reference resistor 13, having a resistance RREF, is shown in FIG. 1A. During sensing of electrically programmable fuse 12, a first current is passed through electrically programmable fuse 12 and a second current is passed through reference resistor 13. Typically, the first current is designed to be the same as the second current. A first voltage is developed at node 21 and a second voltage is developed at node 22. The first voltage is proportional to the first current times the resistance, RFUSE, of electrically programmable fuse 12, plus small voltage drops across an NFET (N channel field effect transistor) N10A and an NFET N10B. The second voltage is proportional to the second current times the resistance, RREF, of reference resistor 13, plus small voltage drops across an NFET N11A and NFET N11B.

Latching circuit 10, comprising an inverter 11, PFETs (P channel field effect transistor) P14, P12, P13, and NFETs N12, N13, and N14) retains a logical value of whether or not electrically programmable fuse 12 is blown or unblown, as long as signal FSET 15 is active and PRECHARGE 14 and SIGDEV 16 are inactive. For example, if electrically programmable fuse 12 is unblown, RFUSE will be less than RREF, and therefore, when PRECHARGE 14 is active and SIGDEV 16 is active, node 21 will be of lower voltage than node 22, and latching circuit 10 will "remember" that electrically programmable fuse 12 is unblown. If, on the other hand, electrically programmable fuse 12 is blown, RFUSE will be greater than RREF, and node 21 will be at a higher voltage than node 22. Latching circuit 10 will remember that electrically programmable fuse 12 is blown.

In FIG. 1A, to sense whether electrically programmable fuse 12 is blown or unblown, PRECHARGE 14 is activated ("low", in FIG. 1A). PFETs P10 and P11 drive both nodes 21 and 22 high. SIGDEV 16 is activated to enable currents from P10 and P11 to pass through electrically programmable fuse 12 and reference resistor 13, respectively. FSET 15 is then activated to enable latching circuit 10. In some implementations, FSET 15 is not used, with a gate of P14 simply being tied to ground and a gate of N14 being tied to Vdd. In another implementation, P14 and N14 are not implemented, with sources of P12 and P13 connected to VDD, and sources of N12 and N13 are coupled to ground. Latching circuit 10 latches the state of electrically programmable fuse 12 based on a difference between nodes 21 and 22 when SIGDEV 16 falls, FSET 15 is active and PRECHARGE 14 is inactive, as will be explained below with reference to FIG. 1B.

SIGDEV 16 is used in an embodiment to turn off N10A and N11A when electrically programmable fuse 12 is being programmed (blown). In a second embodiment, SIGDEV 16 is not used, and N10A and N11A are simply replaced by wires (conducting elements on the silicon chip, such as copper, aluminum, or silicided polysilicon). However, in such a second embodiment, any time PRECHARGE 14 is active, current flows from P10 and P11, which may dissipate more power than is desirable.

FIG. 1B shows a typical timing diagram of signals during a sense of electrically programmable fuse 12. PRECHARGE 15 begins "low", turning on P10 and P11. At time T1, SIGDEV 16 is activated, thereby allowing currents from P10 and P11 to pass through electrically programmable fuse 12 and reference resistor 13, respectively. Nodes 21 and 22 are "high" (at Vdd) when PRECHARGE 14 is "low" and SIGDEV 16 is low. At T1, when SIGDEV is activated, node 21 goes to a voltage equal to current from P10 times RFUSE (plus small voltage drops across N10A and N10B); node 22 goes to a voltage equal to current from P11 times RREF (plus small voltage drops across N11A and N11B). Note that, in FIG. 1B, subsequent to time T1, there is a voltage difference between nodes 21 and 22, because node 21 will be lower than node 22 if electrically programmable fuse 12 is unblown; node 21 will be higher than node 22 if electrically programmable fuse 12 is blown, as described earlier.

At time T2, in FIG. 1B, FSET 15 is activated, enabling latching circuit 10. A Node voltage difference between node 21 and node 22 becomes slightly larger as shown. This is because a fraction of current from P14 goes to the "higher" of nodes 21 and 22, and a fraction of current through N14 comes from the "lower" of nodes 21 and 22.

At time T3, PRECHARGE 14 is deactivated (made "high" in the circuit of FIG. 1A). Subsequent to T3, only current from P14 flows to the "higher" of nodes 21, 22. P14 is typically designed to provide less current than P10 or P11. Since less voltage is therefore developed at the higher of nodes 21 and 22, a relatively small voltage, shown as VFM1 in FIG. 1B, remains as the voltage difference between nodes 21 and 22 at time T4.

A final logical value for the state of electrically programmable fuse 12 is latched into latching circuit 10 at time T4 upon deactivation of SIGDEV 16. It will be noted that only a small voltage difference, shown as VFM1, from node 21 to node 22 is present at time T4. When SIGDEV 16 falls at T4, latching circuit 10 will store a "1" or a "0" indicative of the state (i.e., "blown" or "unblown") of electrically programmable fuse 12, depending on whether node 21 or node 22 was "higher" when SIGDEV 16 falls at time T4. Latching circuit 10 will retain this state until PRECHARGE 14 is again asserted.

Use of latching circuit 10 is implemented for several reasons. First, power dissipated in latching circuit 10 is close to zero when PRECHARGE 14 and SIGDEV 16 are not active. Second, continuously running current through an electrically programmable fuse may eventually electromigrate the silicide on an electrically programmable fuse, possibly making the electrically programmable fuse appear to be "blown", even though the electrically programmable fuse has not been blown.

Designers of electronic systems need to deal with noise, capacitive coupling, and mistracking. In the circuit of FIG. 1A, suppose that node 21 is slightly lower than (e.g., VFM1 volts) node 22 when SIGDEV 16 falls at time T4. Further suppose that there exists crosstalk from some other signal capacitively coupled to node 21 or node 22 (other signal not shown; however, modern semiconductor chips have thousands, if not millions, of signals, one or more of which may be capacitively coupled to node 21 or node 22). Since the value of VFM1 is small, even a relatively small voltage change (i.e., a rise on node 21 or a fall on node 22 in the example) could cause latching circuit 10 to store an incorrect result of a blown/unblown state of electrically programmable fuse 12. Similarly, FET (field effect transistor) thresholds and FET device widths and lengths do not track perfectly from a first FET to a second FET. As circuits become smaller and smaller, amounts of threshold voltage or width or length mistracking become relatively larger. Because of such mistracking, it may be that an inverter comprising P12 an N12 has a lower switching voltage point than the switching voltage point of an inverter comprising P13 and N13. Therefore, for small values of VFM1, even if node 21 is slightly lower in voltage than node 22, latching circuit 10 may store an incorrect result of the blown/unblown state of electrically programmable fuse 12.

Therefore, there is a need for further improvement in sensing whether an electrically programmable fuse is blown or unblown.

SUMMARY OF THE INVENTION

The present invention provides a method and apparatus for robust sensing of an electrically programmable fuse. A larger voltage difference is presented to a latching circuit at a latching time than in previous electrically programmable fuse sensing circuit.

In an embodiment, the electrically programmable fuse sensing circuit comprises an electrically programmable fuse and a reference resistance, the electrically programmable fuse having less resistance than the reference resistance when the electrically programmable fuse is unblown but the electrically programmable fuse has more resistance than the reference resistance when the electrically programmable fuse is blown. A first current source passes current through a first switch and the electrically programmable fuse, producing an electrically programmable fuse voltage. A second current source passes current through a second switch and the reference resistance, producing a reference voltage. At a latching time, simultaneously the first current source and the second current source are shut off and the first and second switches are opened. The latching circuit latches a logical value responsive to the difference between the electrically programmable fuse voltage and the reference voltage.

In a method embodiment, steps of turning on a first current source producing a first current and turning on a second current source producing a second current are performed. Steps of turning on a first switch to pass the first current through an electrically programmable fuse producing an electrically programmable fuse voltage at a first node, and turning on a second switch to pass the second current through a reference resistance producing a reference voltage at a second node is performed. At a latching time the step of simultaneously turning off the first current source, the second current source, opening the first switch and the second switch, and latching a value in a latching circuit responsive to a difference between the electrically programmable fuse voltage and the reference voltage is performed.

DETAILED DESCRIPTION OF THE PREFERRED EMBODIMENTS

In the following detailed description of the preferred embodiments, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

The present invention provides an improved apparatus for sensing whether an electrically programmable fuse is blown or unblown.

In the literature a "blown" electrically programmable fuse is also called a "programmed" electrically programmable fuse. Similarly, an "unblown" electrically programmable fuse is called an "unprogrammed" electrically programmable fuse. The process of blowing a particular electrically programmable fuse is often referred to as programming the particular electrically programmable fuse.

It will be appreciated that there also exist "antifuse" versions of electrically programmable fuses. An antifuse version of an electrically programmable fuse has a relatively higher resistance when unblown, and a relatively lower resistance when blown. Antifuse embodiments of electrically programmable fuses are within the scope and spirit of the present invention; however, for simplicity, embodiments shown are directed to electrically programmable fuses having a relatively lower resistance when not blown (i.e., are unprogrammed) and a higher resistance when blown (i.e., are programmed).

Figure 1A:
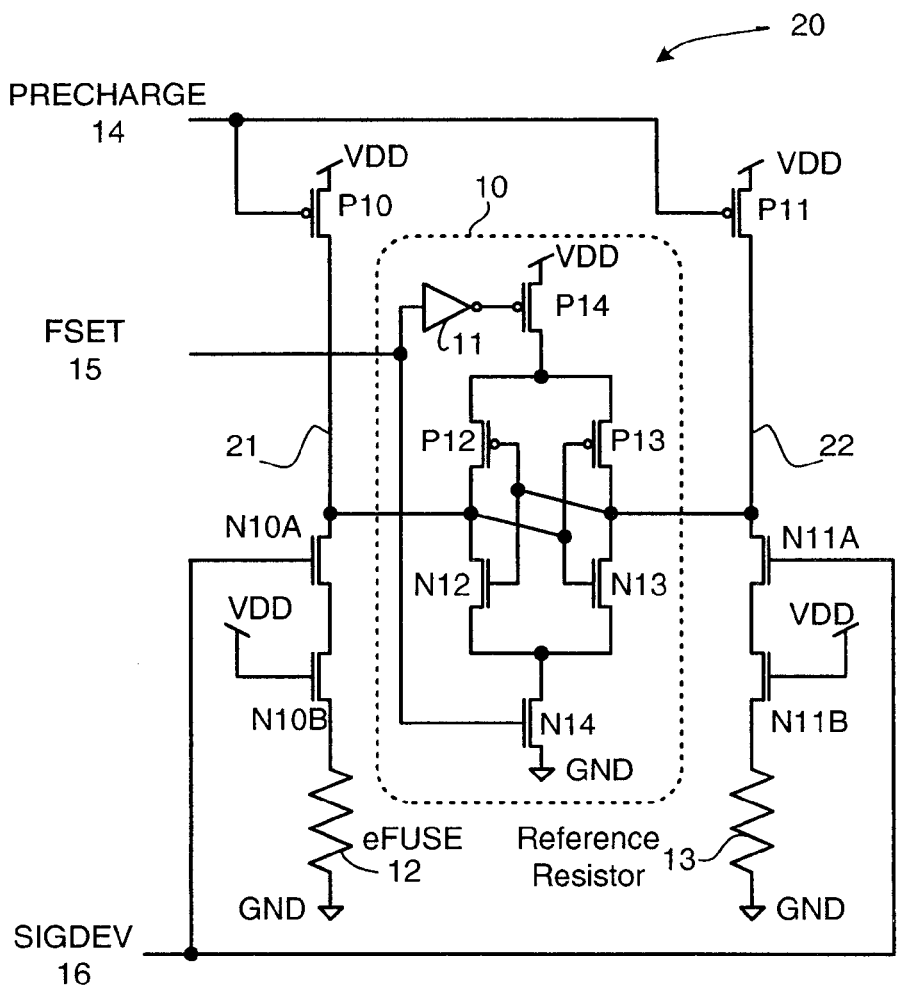
FIG. 1A is prior art drawing of an electrically programmable fuse sense circuit.
Figure 2A:
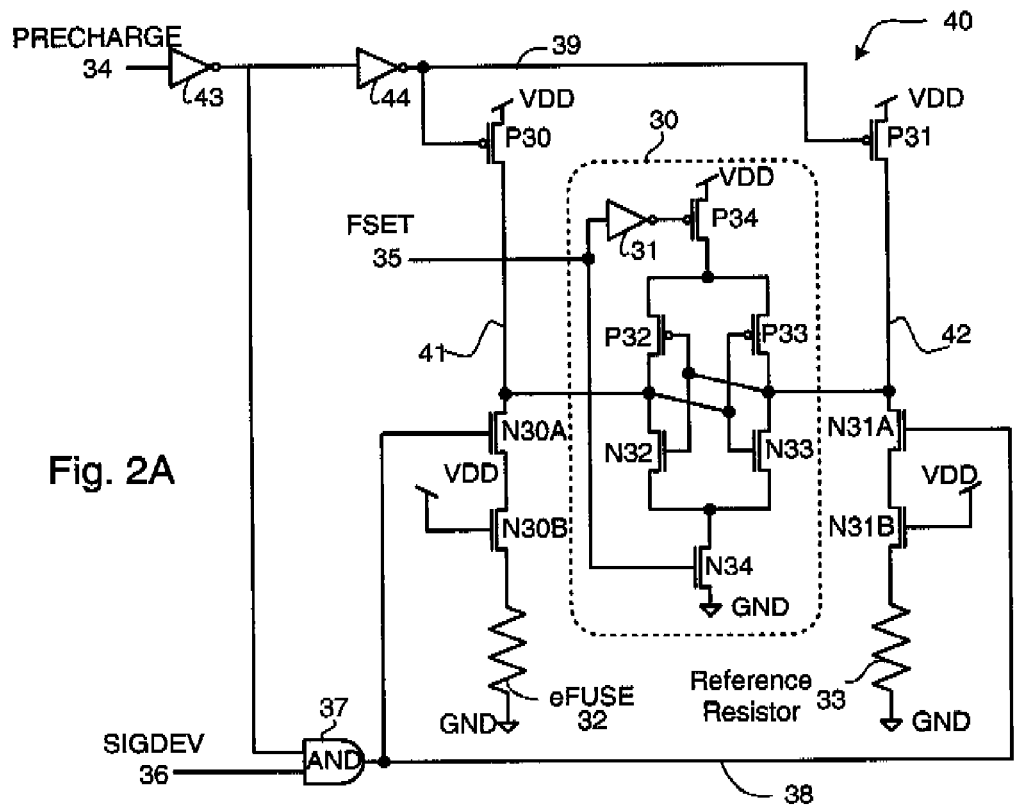
FIG. 2A is a drawing of an electrically programmable fuse sense circuit according to an embodiment of the invention.

FIG. 2A shows sense circuit 40 according to an embodiment of the invention. Sense circuit 40 comprises a latching circuit 30, similar to latching circuit 10 of FIG. 1A. Latching circuit 30 includes PFETs P34, P32, P33, N32 N33, N34, and, optionally, inverter 31. Inverter 31 is used when FSET 35 is implemented. In an alternate embodiment, FSET 35 and inverter 31 are not used, and a gate of P34 is coupled to ground, and a gate of N34 is coupled to Vdd. In another alternative embodiment, P34 and N34 are not implemented; instead, sources of P32 and P33 are connected to VDD and sources of N32 and N33 are connected to ground.

In sense circuit 40 of FIG. 2A, P30, like P10 of FIG. 1A, provides a first current, when PRECHARGE 34 is active and when node 38 is "high", through electrically programmable fuse 32, which has a resistance value, RFUSE, determined by whether electrically programmable fuse 32 is blown or unblown. RFUSE, for electrically programmable fuse 32, like RFUSE for electrically programmable fuse 12 in FIG. 1A, has a relatively higher resistance value when electrically programmable fuse 32 is blown than when electrically programmable fuse 32 is unblown. P31 supplies a second current through reference resistor 33 when PRECHARGE 34 is active and when node 38 is "high".

NFETs N30B and N31B are used to protect NFETs N30A and N31A during fuse blow of electrically programmable fuse 32 and are relatively large (i.e., have relatively large width to length ratios) in order to pass enough current for the fuse blow of electrically programmable fuse 32. Being large, relatively small voltage drops occur across N30B, N31B, N30A, and N31A from currents supplied by P10 and P11. N30A and N31A are similarly designed, and, likewise, N30B and N31B are similarly designed in order that the relatively small voltage drop from the first current through N30A and N30B is similar to the relatively small voltage drop from the second current through N31A and N31B.

Nodes 41 and 42 are connected to latching circuit 30 as shown. Nodes 41 and 42 are connected, respectively to true and compliment nodes of latching circuit 30.

Inverter 43 inverts PRECHARGE 34. Inverter 44 drives an output at node 39, node 39 having the same logical value as PRECHARGE 34.

AND 37 has a first input connected to an output of inverter 43 and a second input connected to SIGDEV 36. An output of AND 37 is connected to signal 38. Signal 38 is further connected to a gate of N30A and a gate of N31A.

Figure 1B:
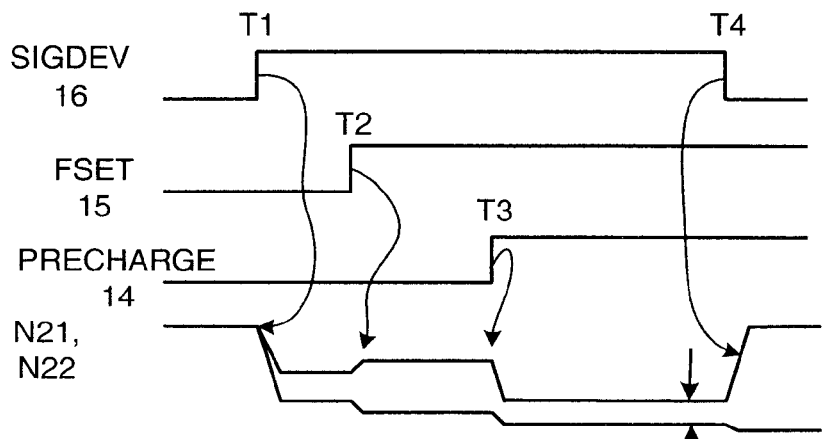
FIG. 1B is a prior art drawing of waveforms in the electrically programmable fuse sense circuit of FIG. 1A.

AND 37 is designed to have substantially the same delay as inverter 44 so that, when PRECHARGE 34 rises, node 39 rises at substantially the same time that node 38 falls. It will be appreciated that, if P30 and P31 are turned off significantly before N30A and N31A are turned off, nodes 41 and 42 will drop significantly and voltages on nodes 41 and 42 would be similar to those of nodes 21 and 22 in FIG. 1B subsequent to time T3, leaving only a small voltage (VFM1) difference for latching circuit 30 to attempt to latch. On the other hand, if N30A and N31A are turned off significantly before P30 and P31, nodes 41 and 42 will be charge to (or near) Vdd, again leaving only a small (or no) voltage difference for latching circuit 30 to attempt to latch. "Substantially the same delay", or, alternatively "simultaneous", in reference to turning off P30, P31, N30A, and N31A, will be interpreted as happening close enough to the same time such that the voltage difference between nodes 41 and 42 does not significantly change due to currents from P30 and P31 or into N30A and N31A when PRECHARGE 34 goes inactive (see waveform descriptions below with reference to FIG. 2B). A significant change in the voltage difference between nodes 41 and 42 due to currents from P30, P31, N30A, and N31A when PRECHARGE 34 goes inactive would be greater than 50% of a voltage difference change between nodes 41 and 42 when P30, P31, N30A, and N31A are all turned on.

It will be appreciated that in alternative embodiments, equivalent Boolean function will cause PRECHARGE 34 to simultaneously turn off the current sources (P30 and P31 of FIG. 2A) and open switches to ground (shown as N30A and N31A in FIG. 2A).

SIGDEV 36 is used in an embodiment to turn off N30A and N31A when electrically programmable fuse 32 is being programmed (blown). In a second embodiment, SIGDEV 36 is not used, and N30A and N31A are simply replaced by wires (conducting elements on the silicon chip, such as copper, aluminum, or silicided polysilicon). However, in such a second embodiment, any time PRECHARGE 34 is active, current flows from P30 and P31, which may dissipate more power than is desirable. In the second embodiment, P30 and P31 may be directly driven by PRECHARGE 34, and N30A and N31A may be driven by an inverted PRECHARGE 34 signal, with attention paid to making P30, P31, N30A, and N31A turn off simultaneously.

Figure 2B:
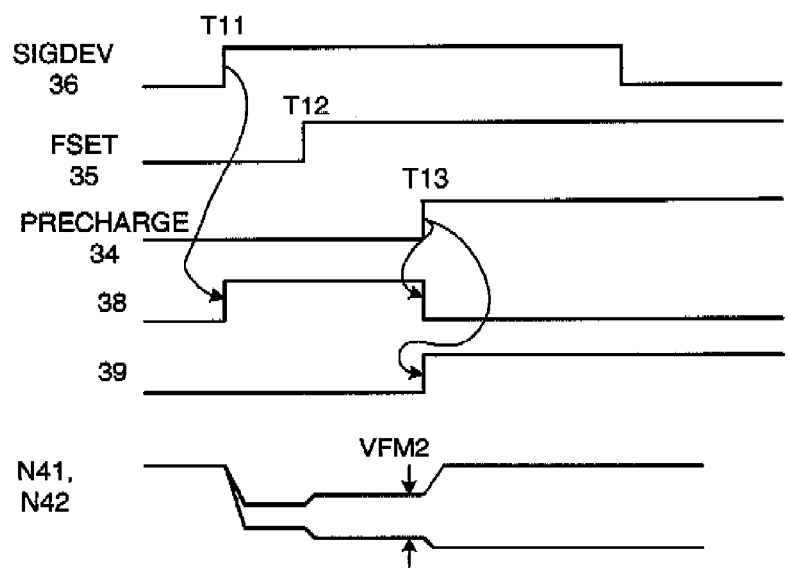
FIG. 2B is a drawing of waveforms in the electrically programmable fuse sense circuit of FIG. 2A.

FIG. 2B illustrates signal values at SIGDEV 36, FSET 35, PRECHARGE 34, node 38, node 39, node 41, and node 42 according to the schematic of FIG. 2A.

PRECHARGE 34 begins at an active level ("low"), with node 39 turning on P30 and P31, thereby charging nodes 41 and 42 high. At time T11 in FIG. 2B, SIGDEV 36 becomes active (goes high), causing node 38 to go high, which turns on N30A and N31A, allowing currents from P30 and P31 to flow through electrically programmable fuse 32 (and N30B) and reference resistor 33 (and N31B), respectively. A voltage difference between node 41 and node 42 is shown between times T11 and T12 in FIG. 2B. Node 41 voltage is equal to the first current times the resistance of electrically programmable fuse 32 (plus small voltage drops across N30A and N30B as described). Node 42 voltage is equal to the second current times the value of the reference resistance 33 (plus small voltage drops across N31A and N31B). At time T12, FSET is activated, causing the node 41 to node 42 voltage difference to change slightly to be VFM2 as shown in FIG. 2B. The higher of nodes 41 and 42 gets slightly higher due to more current flowing through P32 (or P33) flowing into the higher node. The lower of nodes 41 and 42 gets slightly lower due to more current flowing through N33 (or N32) flowing from the lower node.

At time T13 (a "latching time") in FIG. 2B, PRECHARGE 34 rises, simultaneously turning off P30, P31, N30A and N31A. Latching circuit 30 has voltage VFM2 as a latch input to resolve to a "1" or a "0" at time T13 of FIG. 2B. It will be remembered that latching circuit 10 in FIG. 1A had VFM1 as a latch input to resolve to a "1" or a "0" at time T4 in FIG. 1B. For a given value of RFUSE (electrically programmable fuse 12, electrically programmable fuse 32) and RREF (reference resistors 13, 33), VFM2 will be considerably larger than VFM1, since VFM2 is proportional to larger currents in the respective resistances (electrically programmable fuse 32 and reference resistor 33) than flow through resistances of electrically programmable fuse 12 and reference resistor 13 when latching occurs. Latching occurs at time T13 (FIG. 2B) of sensing circuit 40 in FIG. 2A. Latching occurs at time T4 (FIG. 1B) of sensing circuit 20 in FIG. 1A. The larger VFM2 voltage of sense circuit 40 when latching occurs provides for greater immunity to noise, capacitive coupling, and FET mistracking than the smaller VFM1 voltage of electrically programmable fuse sensing circuit 20.

For explanatory purposes, suppose that P10 and P11 of electrically programmable fuse sensing circuit 20, and P30 and P31 of electrically programmable fuse sensing circuit 40, when turned on, provide 1 mA (milliamp) of current. Suppose that P14 and P34 provide 0.1 mA of current. Suppose that electrically programmable fuse 12 and electrically programmable fuse 32, when unblown, have a resistance of 1K$\Omega$, and, when blown, have a resistance of 1.5K$\Omega$. Latching circuit 10 (and latching circuit 40) provides some small current to nodes 21 and 22 (and nodes 41 and 42), as explained earlier. For simplicity, assume that approximately 0.05 mA flows to the "higher voltage node" of nodes 21 and 22 (and nodes 41 and 42) and that approximately −0.05 mA flows to the "lower voltage node" of nodes 21 and 22 (and nodes 41 and 42). For simplicity, further suppose that the value, RREF of reference resistors 13 and 33 is 1.25K$\Omega$. For simplicity, ignore voltage drops across N10A, N10B, N11A, N11B, N30A, N30B, N31A, and N31B, since these FETs are designed to be large in order to pass sufficient current to blow electrically programmable fuses 12 and 32. As explained earlier, N10A and N11A, N10B and N11B, N30A and N31A, and N30B and N31B are designed such that each pair have similar small voltage drops due to their respective first current or second current.

Consider now the values of VFM2 (FIG. 2B) when latching circuit 30 of sense circuit 40 resolves the voltages on nodes 41 and 42 and latches the state of electrically programmable fuse 32. When PRECHARGE 34 is asserted, FSET 35 is active, and electrically programmable fuse 32 is unblown, the node voltage at node 41 is:

$$1K\Omega *(1\,mA-0.05\,mA)=0.95\,volts$$

and the node voltage at node 42 is:

$$1.25K\Omega *(1\,mA+0.05\,mA)=1.313\,volts$$

Thus, at time T13, when latching circuit 30 resolves the state of the inputs of latching circuit 30 when electrically programmable fuse 32 is unblown, the difference between nodes 41 and 42 (VFM2) is 0.363 volts.

When PRECHARGE 34 is asserted, FSET 35 is active, and electrically programmable fuse 32 is blown, the node voltage at node 41 is:

$$1.5K\Omega, *(1\,mA+0.05\,mA)=1.577\,volts$$

and the node voltage at node 42 is $$1.25K\Omega, *(1\,mA-0.05\,mA)=1.188\,volts.$$

Thus, at time T13, when latching circuit 30 resolves the state of the inputs of latching circuit 30 when electrically programmable fuse 32 is blown, the difference between nodes 41 and 42 (VFM2) is 0.389 volts.

Considering now VFM1 of sense circuit 20 of FIG. 1A, when PRECHARGE 14 is not asserted (i.e., between times T3 and T4 of FIG. 1A), FSET 15 is active. When electrically programmable fuse 12 is blown, the node voltage at node 21 is:

$$1.5K\Omega, *(0.05\,mA)=0.075\,volts\,(approximately)$$

and the node voltage at node 22 is: (since both note 21 and node 22 will be near zero volts, both N12 and N13 will be "off", and the 0.1 mA from P14 will split approximately equally between electrically programmable fuse 12 and reference resistor 13).

$$1.25K\Omega, *(0.05\,mA)=0.063\,volts.$$

Thus, at latching time T4, when latching circuit 10 resolves the state of the inputs of latching circuit 10 when electrically programmable fuse 12 is blown, the difference between nodes 21 and 22 (VFM1) is (0.075−0.063=0.012) volts. 0.012 volts is a very small difference, and mistracking between FET device sizes or FET threshold voltages could cause latching circuit 10 to latch an incorrect electrically programmable fuse state value.

Similarly, now considering VFM1 of sense circuit 20 of FIG. 1A, when PRECHARGE 14 is not asserted (i.e., between times T3 and T4 of FIG. 1A), FSET 15 is active. When electrically programmable fuse 12 is unblown, the node voltage at node 21 is:

$$1.0\,K\Omega, *(0.05\,mA)=0.050\,volts\,(approximately)$$

and the node voltage at node 22 is: (since both note 21 and node 22 will be near zero volts, both N12 and N13 will be "off", and the 0.1 mA from P14 will split approximately equally between electrically programmable fuse 12 and reference resistor 13).

$$1.25\,K\Omega, *(0.05\,mA)=0.063\,volts.$$

Thus, at latching time T4, when latching circuit 10 resolves the state of the inputs of latching circuit 10 when electrically programmable fuse 12 is unblown, the difference between nodes 21 and 22 (VFM1) is (0.050−0.063=0.013) volts. 0.013 volts is a very small difference, and mistracking between FET device sizes or FET threshold voltages could cause latching circuit 10 to latch an incorrect electrically programmable fuse state value.

It will be understood that the above assumptions and calculations are for descriptions only and are approximate and simplified for easy understanding. It is apparent, nonetheless, that latching circuit 30 has a much larger voltage difference (VFM2) between nodes 41 and 42 when latching occurs (i.e., time T13) than does latching circuit 10 between nodes 21 and 22 when latching occurs (time T4). The much larger voltage difference (VFM2 versus VFM1) when latching occurs makes electrically programmable fuse sense circuit 40 more insensitive to noise, capacitive coupling, and FET device mismatches (FET widths, FET lengths, FET thresholds) than electrically programmable fuse sense circuit 20.

It is understood that embodiments may include scaling. For example, in an embodiment, P31 is designed such that the second current is half the first current. In such an embodiment, N31A and N31B would have half the width to length ratio of their counterparts N30A and N30B. In such an embodiment, reference resistance 33 has twice the resistance of an embodiment where no scaling is implemented.

Figure 3:
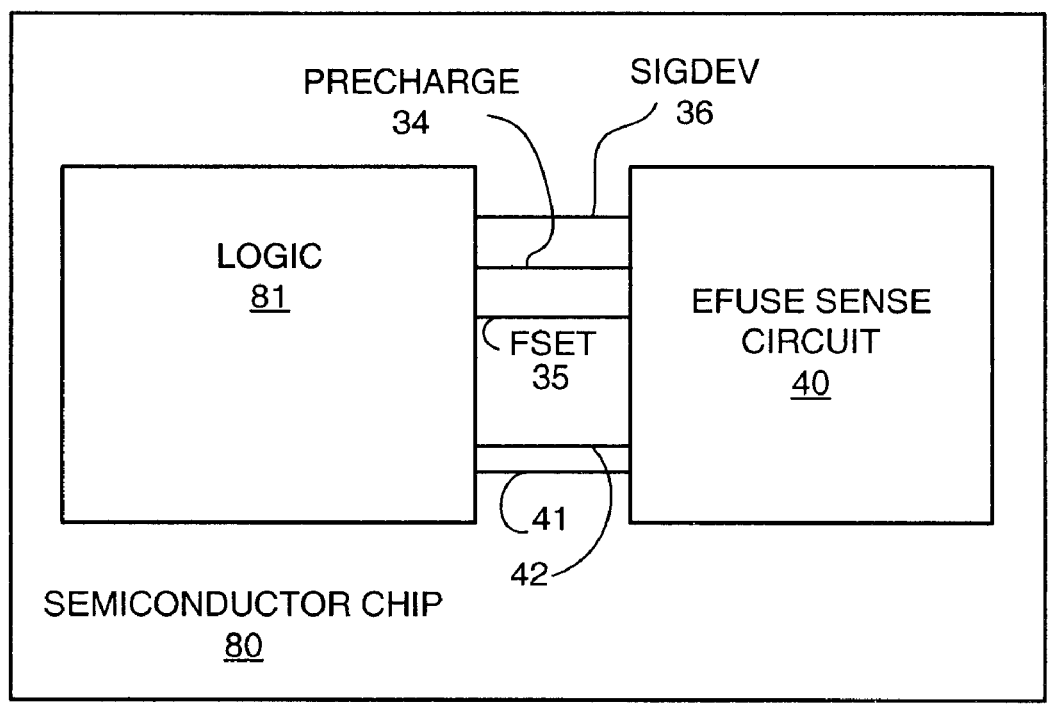
FIG. 3 is a drawing of a semiconductor chip including the electrically programmable fuse sense circuit of FIG. 2A.

Turning now to FIG. 3, electrically programmable fuse sense circuit 40, described in detail above, is shown to be placed on a semiconductor chip 80. Semiconductor chip 80 further comprises logic 81. Logic 81 includes circuitry configured to program (blow, when required) an electrically programmable fuse 32 in electrically programmable fuse sense circuit 40. Circuitry configured to program electrically programmable fuse 32 is not shown. Logic 81 includes circuitry configured to drive PRECHARGE 34, and circuitry configured to drive SIGDEV 36 and/or FSET 35 for embodiments including SIGDEV 36 and/or FSET 35. Logic 81 has circuitry configured to use the electrically programmable fuse state as latched in latching circuit 30 (FIG. 2A) of electrically programmable fuse sense circuit 40. Node 41 and/or node 42, when PRECHARGE 34 has been made inactive provide the state of electrically programmable fuse 32 in a digital (i.e., "1" or "0") form. It will be understood that nodes 41 and/or 42 may be buffered by an inverter or other suitable logic gate before being driven from electrically programmable fuse sense circuit 40 to logic 81. Logic 81 may use the value found on nodes 41 and/or 42 to disable, enable, or change a function performed in logic 81.

Figure 4:
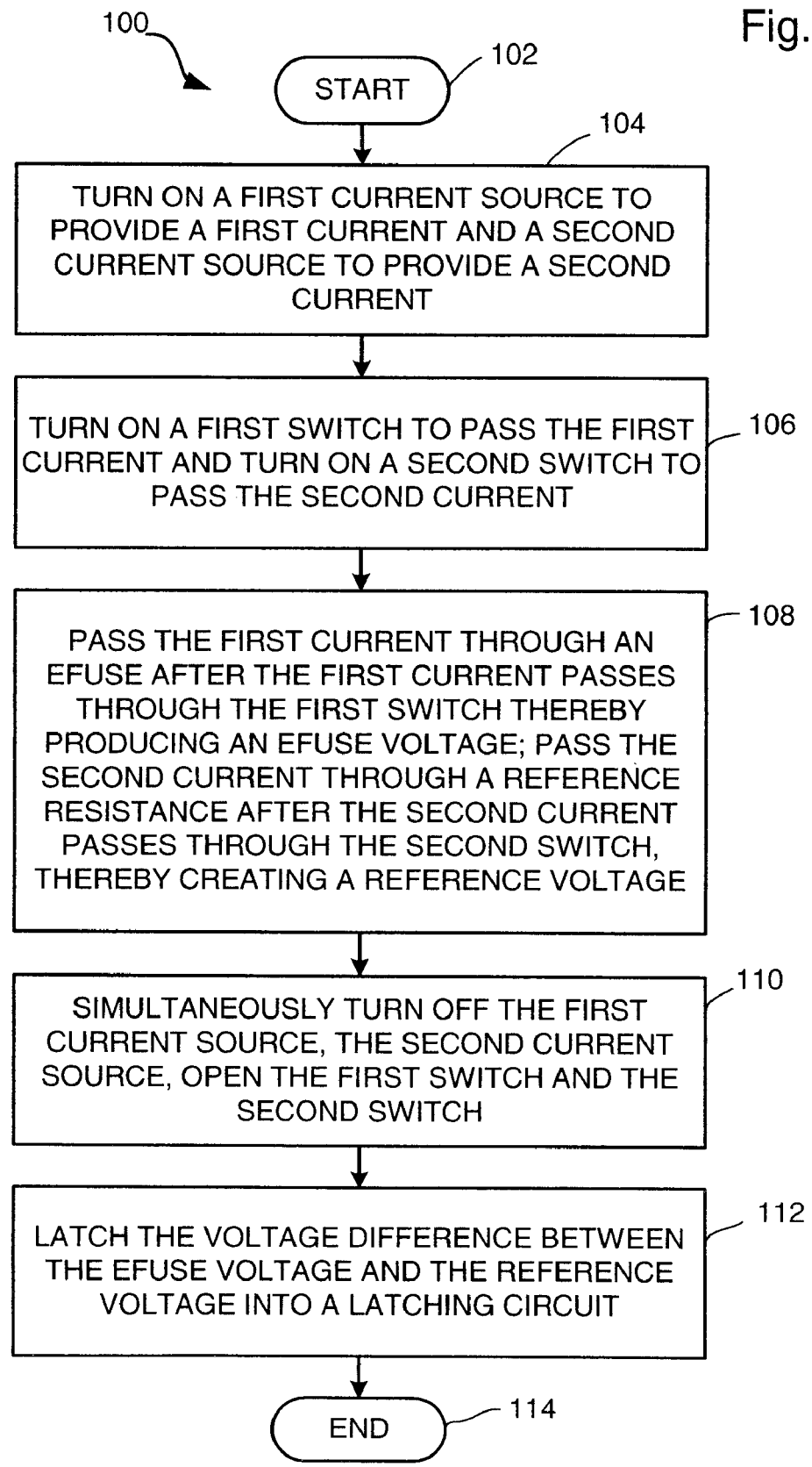
FIG. 4 is a method embodiment of the invention.

FIG. 4 shows a flow chart of a method 100 according to an embodiment of the invention. Method 100 begins at step 102. In step 104 a first current source is turned on, providing a first current. The first current source corresponds to P30 of FIG. 2A, which is turned on by PRECHARGE 34. A second current source is turned on, providing a second current. The second current source corresponds to P31 of FIG. 2A, which is turned on by PRECHARGE 34.

In step 106, a first switch is turned on to pass the first current. The first switch corresponds with N30A in FIG. 2A, which is turned on by a logical combination (e.g., AND 37 in FIG. 2A) of PRECHARGE 34 and SIGDEV 36. A second switch is turned on to pass the second current. The second switch corresponds with N31A of FIG. 2A. N31A is also turned on by the logical combination of PRECHARGE 34 and SIGDEV 36.

In step 108, the first current passed through the first switch is further passed through an electrically programmable fuse (e.g., electrically programmable fuse 32 of FIG. 2A), developing a first voltage (e.g., voltage at node 41 in FIG. 2A) from the voltage drop across the electrically programmable fuse. As shown in FIG. 2A there may be other elements, such as N30B, in series with the electrically programmable fuse. Such elements should cause small voltage drops relative to voltage drops across the electrically programmable fuse, and as shown in FIG. 2A, such elements should have similar elements in series with a reference resistor. Similarly, the second current passed through the second switch is further passed through a reference resistance (e.g., reference resistance 33 of FIG. 2A) developing a second voltage (e.g., voltage at node 42 in FIG. 2A). N31B is designed to be similar to N30B in order that the relatively small voltage drop across N31B is similar to the voltage drop across N30B. The first voltage is called an electrically programmable fuse voltage; the second voltage is called a reference voltage. As described earlier, if the electrically programmable fuse is unblown, the electrically programmable fuse voltage will be less than the reference voltage; if the electrically programmable fuse is blown, the electrically programmable fuse voltage will be greater than the reference voltage.

In step 110, at a latching time, the first current source and the second current source are turned off simultaneously. At the same time that the first current source and the second current source are turned off, the first switch and the second switch are opened simultaneously, effectively isolating a first node having the electrically programmable fuse voltage (node 41 in FIG. 2A) from receiving current from the first current source or losing current through the first switch and through the electrically programmable fuse. Turning off the second switch effectively isolating a second node having the reference voltage (node 42 in FIG. 2A) from receiving current from the second current source or losing current through the second switch and through the reference resistor.

In step 112, a latching circuit latches a digital value responsive to a voltage difference between the electrically programmable fuse voltage and the reference voltage that exists at the latching time.

The true and complement values of the latch are coupled to the first node and to the second node, respectively, and may be buffered and driven to logic that needs to receive the state of the electrically programmable fuse (i.e., whether the electrically programmable fuse is blown or unblown).

Step 114 ends method 100.

What is claimed is:

1. A method for sensing a state of an electrically programmable fuse comprising the steps of:

turning on a first current source, thereby producing a first current;

turning on a second current source, thereby producing a second current;

turning on a first switch, thereby passing the first current through an electrically programmable fuse, producing an electrically programmable fuse voltage at a first node;

turning on a second switch, thereby passing the second current through a reference resistance, producing a reference voltage at a second node; and at a latching time, logically combining a first signal and a second signal, the second signal not switching at the same time as the first signal, thereby producing one or more signals timed for simultaneously performing the steps of:

turning off the first current source and the second current source; and opening the first switch and the second switch; and latching a value in a latching circuit responsive to a difference between the electrically programmable fuse voltage and the reference voltage.

* * * * *